United States Patent [19]
Berndt et al.

[11] Patent Number: 4,785,422
[45] Date of Patent: Nov. 15, 1988

[54] SIMULTANEOUS READ/WRITE RAM

[75] Inventors: Dale F. Berndt, Plymouth; David L. McCall, Lake Elmo, both of Minn.; Thomas R. Arneberg, Woodland Park, Colo.

[73] Assignee: Unisys Corporation, Blue Bell, Pa.

[21] Appl. No.: 907,757

[22] Filed: Sep. 15, 1986

[51] Int. Cl.$^4$ .................. G11C 11/34; G11C 7/00; G11C 7/02

[52] U.S. Cl. .................. 365/242; 365/177; 365/189; 365/207

[58] Field of Search ............. 365/177, 242, 207, 189, 365/174; 357/43

[56] References Cited

U.S. PATENT DOCUMENTS

| | | | |
|---|---|---|---|
| 4,125,880 | 11/1978 | Taylor | 365/242 |
| 4,349,895 | 9/1982 | Isogai | 365/242 |
| 4,607,172 | 8/1986 | Fredericksen et al. | 365/207 |
| 4,608,667 | 8/1986 | Barry | 365/242 |
| 4,641,283 | 2/1987 | Wilhelm | 365/207 |

Primary Examiner—Terrell W. Fears
Assistant Examiner—Melissa J. Koval
Attorney, Agent, or Firm—Douglas L. Tschida; Charles A. Johnson

[57] ABSTRACT

An alpha particle resistant memory cell and array with complementary, differential data in, data out and write enable inputs capable of independent, simultaneous read/write operations. During write operations, clocked differential write and data inputs steer cell current to induce differential cell voltages indicative of the stored data. During read operations, a read select input shifts the voltage levels of the selected cell to produce a distinguishable output which dominates over the other cells to appropriately steer current at a sense amplifier to identify the binary cell contents. A 64 row by 12 bit register stack, with split word write, master reset and read enable is also disclosed.

15 Claims, 4 Drawing Sheets

SENSE AMPLIFIER

SIMULTANEOUS READ/WRITE RAM

BACKGROUND OF THE INVENTION

The present invention relates to differential memory cells and, in particular, to an emitter coupled bipolar cell capable of being simultaneously read and written. A register stack constructed from a plurality of the present cells is also disclosed which provides for a master reset, split word write and read enable.

As with all things, a computer's performance is dependent upon the performance of each of its constituent sub-systems. Of such sub-systems, a register stack and/or random access memory is most commonly provided in association with a central processor for making available necessary data to the processor at appropriate times. Accordingly, among other things, it is desirable in advanced computer design to have available a high performance RAM requiring relatively short read and write times.

Alternatively, it is desirable if multiple memory functions can be carried out simultaneously. The obvious advantage is that the designer, relative to other ongoing machine operations, is then able to allow the reading of an addressed memory location, while simultaneously allowing other sub-systems to write either the same memory location or other available memory locations. Timing bottlenecks may thus be reduced, while enhancing system throughput. Heretofore, however, memories capable of truly simultaneous and independent read/write operations were not available to the computer designer.

One attempt at developing such a memory can be found upon directing attention to an article from the IEEE International Solid-State Circuits Conference of 1977 at pages 72-74. There, a 32×9 ECL two port complementary memory is disclosed, wherein each memory cell is constructed of four transistors. However, in addition to consuming relatively large amounts of operating power, the cell design is believed deficient in that cell function is restricted in situations where the read address equals the write address or, in other words, where the system simultaneously attempts to read and write the same cell location.

Another example can be found in a 4×4 register file such as manufactured by the Amdahl Corporation under part no. AM25LS17O. This device is constructed using integrated injection logic circuitry and which permits a reduction in component numbers. The device circuitry, however, requires the use of Schottky diodes and a large collector dot or hardwired contact between the data output bus which causes the associated memory cells to be relatively slower in comparison to the present memory cells. Also, extraneous collector pullup resistors are required to ensure proper operation.

Yet another attempt at a memory cell capable of independent, simultaneous read and write operations can be found in a 16×4 read/write register file manufactured by Fairchild Camera and Instruments Corporation under part no. F100145. Actual device operation however is only pseudo-simultaneous with the array operating in a time-shared fashion. That is, even though a cell location may be simultaneously addressed, operations are only performed sequentially.

SUMMARY OF THE INVENTION

It is therefore a primary object of the present invention to make available a memory cell which permits truly independent and simultaneous read/write operations for each memory cell.

It is a further object of the invention to provide a memory cell which is complementary in operation, such that all data input, data output, and write enable signals occur as differential signals.

It is yet another object of the invention to provide memory cells which are relatively insensitive to alpha particles.

It is still another object of the invention to provide a series gated memory cell which can operate over a relatively broad range of supply voltages.

These and other objects are provided for in the present emitter coupled, complementary bipolar memory cell and memory array.

In its constructional details, each of the present cells is constructed about a pair of complementary transistors and relative to which current flow is directed so as to induce a differential collector voltage at the cell's storage transistors. This differential voltage by way of a pair of emitter-follower coupled output transistors and sense amplifier circuitry is reflective of the binary state of the memory cell. Associated, serially coupled complementary transistor pairs responsive to differential data/ndata and write/nwrite input signals controllably gate current flow between a single current source and a pair of resistors coupled to a read select input bus.

During a write operation and irrespective of the read select voltage, upon the occurrence of a clocked write enable input, the data at the data/ndata inputs is clocked into each cell to appropriately steer current flow through the data/ndata and write/nwrite transistors to establish the differential collector voltage at the cell's storage transistors. This voltage separation is thereafter maintained with the write input reverting to a nwrite condition which correspondingly steers current through the nwrite transistor.

During a read operation, a read select signal induces a voltage shift at the collectors of the cell's storage transistors, without disrupting current flow. In particular and without changing the absolute magnitude of the separation between the collector voltages, the collector voltage at one of the transistors is raised to a level distinguishable from the outputs of all the other cells coupled to a complementary data output bus and associated sense amplifier. There another complementary transistor pair responsively steers current to produce a binary output reflective of the interrogated memory cell's stored data.

Alpha particle insensitivity is obtained via the operation of each cell's current source at relatively high DC current levels. This provides sufficient noise margins and alpha particle immunity for encountered environments.

A 64×12 general register stack constructed about an array of the present cells is further disclosed. The array is addressable via associated read address buffer/decoder and read driver circuitry. The write address circuitry, in turn, is configured to provide for a split word-write operation and whereby the upper and lower six bits of each 12 bit word may be independently written.

Associated read enable circuitry, operative for system control purposes, forces the data output buffer to produce a logic low condition on all of its outputs. Master reset circuitry, in turn, forces the writing of all the array's cells to a logic low condition.

The above objects, advantages and distinctions of the present invention, as well as others, along with the details of its operation will however become more apparent upon directing attention to the following description thereof with respect to the appended drawings. Before referring thereto though, it is to be appreciated that the following description is made by way of the presently preferred embodiment only and is not intended to in any way be interpreted as self-limiting. To the extent that modifications have been contemplated, the disclosure will make reference thereto.

DESCRIPTION OF THE PREFERRED EMBODIMENT

Figure 1:
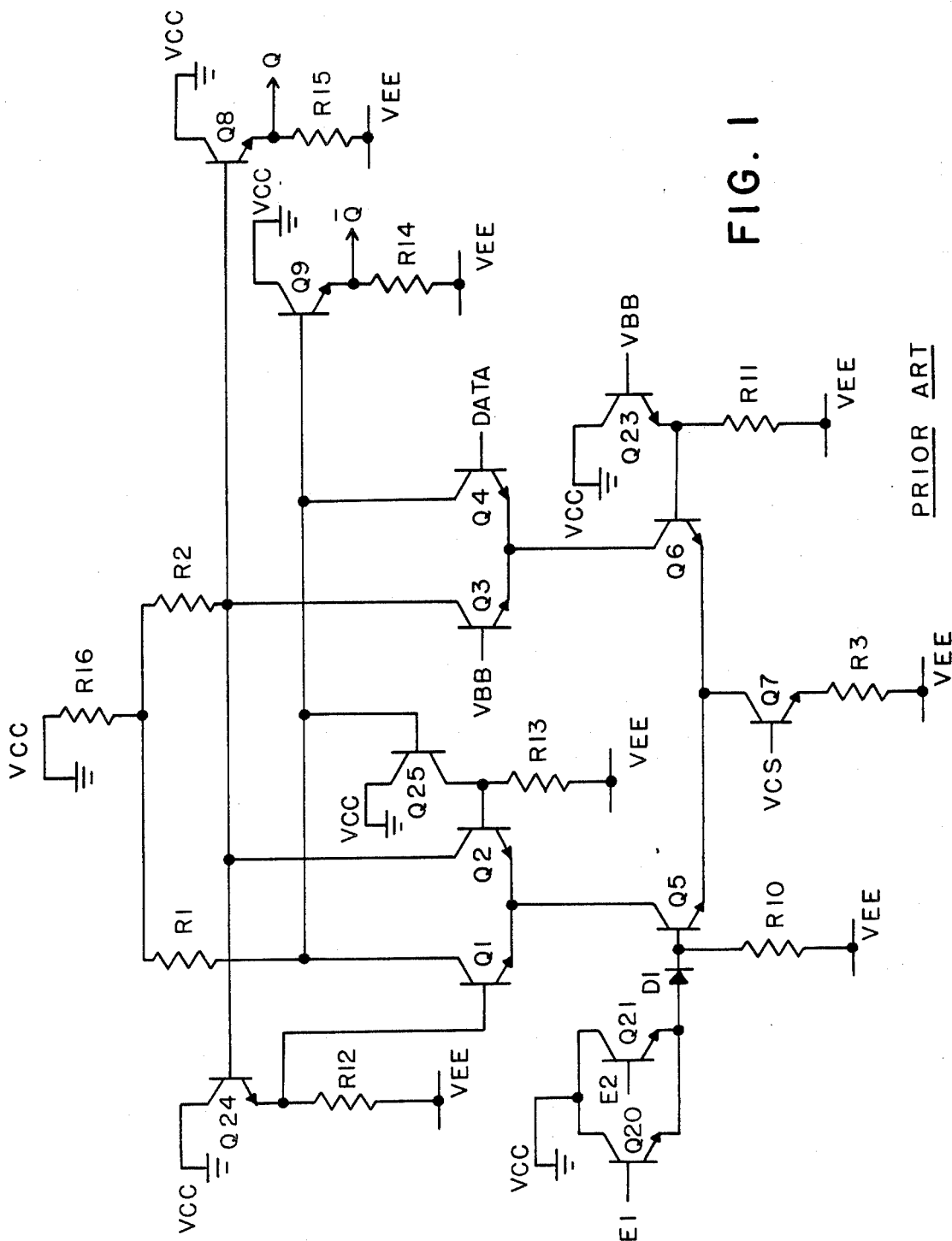
FIG. 1 shows a schematic diagram of a prior art latch circuit bearing some resemblance to the present memory cells.

With attention first directed to FIG. 1, a prior art emitter coupled logic (ECL) interface latch circuit is shown which has some structural similarity to the present invention. This circuit is commonly used in logic operations for temporary storage, pending the completion of other operations and/or to accommodate system timing, etc. The latch in effect therefore operates relative to its E1, E2, clock and data inputs and the fixed reference voltages VEE, VBB and VCC to capture and store data, until such time as the inputs receive new data.

In contrast, the present invention is directed to a complementary memory cell capable of totally independent read and write operations which may also be performed simultaneously. It is accordingly responsive to differential write/nwrite and data/ndata inputs which reduces the device count for each cell and does away with the fixed voltage inputs that were otherwise used in the latch circuitry. Most importantly, though, the circuit is responsive to a read select input, whereby the data of each selected cell may be distinguished from the data of a number of other cells coupled to a memory bus.

From a device standpoint and in contrast to the prior art circuit, the present circuit substitutes differential write and nwrite inputs at the bases of transistors Q5 and Q6; substitutes differential data and ndata inputs at the bases of transistors Q3 and Q4, and couples the collectors of transistors Q3 and Q4 to the bases of output transistors Q8 and Q9; and couples the bases of storage transistors Q1 and Q2 to the collectors of transistors Q3 and Q4. Additionally, the fixed reference voltage at the common coupling point of resistors R1 and R2 has been replaced with a variable read select input. The differential data/ndata output signal at the emitters of Q8 and Q9 thus varies with the read select input to induce one of the transistors Q8 or Q9 to produce an output distinguishable from the outputs of the other cells coupled to the memory bus. This difference represents the binary contents stored in the cell. The details will however be described below with respect to the sense amplifier circuitry of FIG. 3.

Figure 2:
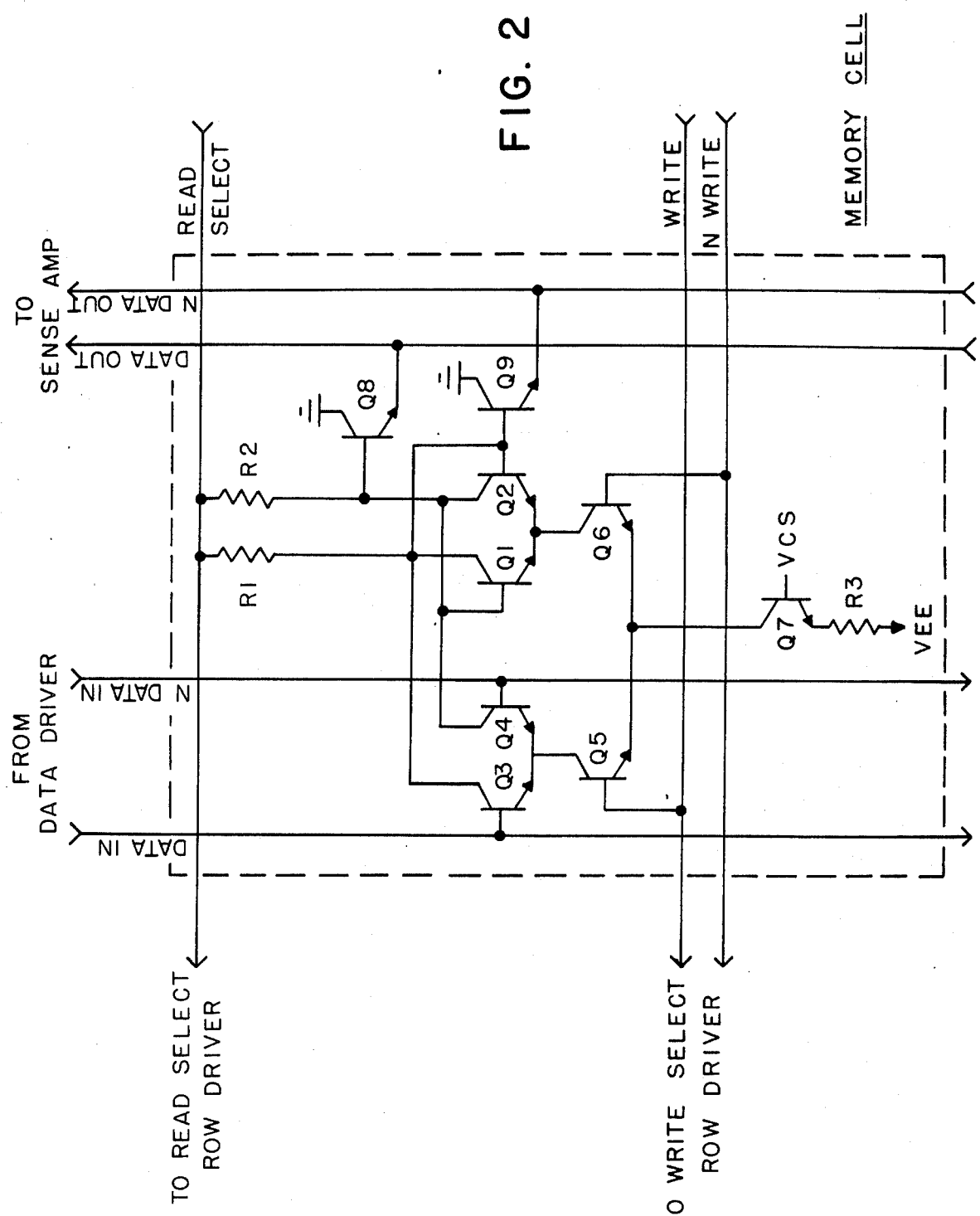
FIG. 2 discloses a schematic diagram of one of the present memory cells.

Directing particular attention first though to FIG. 2, a view is shown of the present memory cell and which finds particular application in general register stacks and scratch pad RAM memories. The cell is constructed about a single current source I1, which along with the mentioned differential input and output signals allows the operation of each cell over a relatively wide range of supply voltages (i.e. over a range down to $4.5 \pm 0.45$ volts).

In its typical application therefore, it is to be appreciated that the memory cell of FIG. 2 would be replicated in a matrix-like array in relation to associated read/write address circuitry, along with complementary data output buses and sense amplifier circuitry for reading and writing the binary state of selected cells. Relative however to a single cell, the data contents is determined via a differential voltage condition established at the collectors of transistors Q1 and Q2, by way of the steering of current through the adjoining circuit paths.

That is, during a write operation, complementary differential data/ndata inputs are coupled to the bases of transistors Q3 and Q4, as the bases of transistors Q5 and Q6 are clocked with write enabling write/nwrite inputs. Depending upon the binary value of the data inputs, a controlling current path is formed from the read select input through one of the resistors R1 or R2 and transistor pairs Q3, Q5 or Q4, Q5 to the current source I1. Depending though which path the current is steered, a differential voltage condition of approximately 0.4 volts is created at the collectors of transistors Q1 and Q2 that is determinative of the cell's binary contents.

Write Operation

Following now the circuitry operation relative to a typical write operation, it is to be appreciated that the read select input nominally is a $-1.2$ volts, whereas VEE is a nominal $-4.5$ volts and VCS a nominal $-3.2$ volts. Because a write operation is to be conducted, associated write circuitry (not shown) operates to couple a complementary write enable signal to the write/nwrite inputs at transistors Q5 and Q6 to cause the base of transistor Q5 to be made more positive than the base of transistor Q6. This condition causes transistor Q5 to conduct and steer current into current source I1, comprised of the current path through transistor Q7, resistor R3 and reference voltage source VEE. At the same time and depending upon the differential voltages at the data/ndata inputs to the bases of transistors Q3 and Q4, one or the other of the transistors is made more conductive relative to the other so as to steer current from the read select input by way of either resistor R1 or R2 and transistor Q5 to the current source I1. Accordingly, if transistor Q3 is conductive, current is steered by way of resistor R1; otherwise, current is steered through transistor Q4 and resistor R2. For purposes of discussion though, it will be assumed that the base of transistor Q3 is raised above that of Q4 and thus more current is steered through resistor R1 than resistor R2.

At this point, it should also be appreciated that irrespective of the voltage level at the read select input, which is nominally either the mentioned $-1.2$ volts or, alternatively, a $-0.8$ volts, during a read select, the current will be steered through the transistors Q3, Q4 in response to the data/ndata input.

With the reversion of the write inputs to a write disable condition, the base of transistor Q6 is made more positive than the base of transistor Q5 which causes the current steering to revert from the transistor pair Q3, Q4 to the transistor pair Q1, Q2. This redirection of the current flow is facilitated by a certain amount of capacitance designed into the cell.

Recognizing further that at the point of termination of the write enable signal, the current flow through resistor R1 makes the base of transistor Q1 more positive than the base of transistor Q2, the current through resistor R1 is merely diverted through the path including transistors Q1 and Q6 and the current source I1. Alternatively, the current would be directed through transistors Q2 and Q6 to I1. In either case though, the relative voltage separation between the collectors of transistors Q1 and Q2 is maintained at a nominal 0.4 volts.

Given the earlier assumption that the predominant current flow is through resistor R1, the collectors of transistor Q1 will be a nominal −1.6 volts and transistor Q2 a nominal −1.2 volts. These collector voltages determine the cell's binary contents and which is coupled by way of transistors Q8 and Q9 to the data/ndata output bus and sense amplifier. It is there that during a read select, the data output bus is monitored and interpreted to ascertain the cell's specific binary contents.

Read Operation

Figure 3:
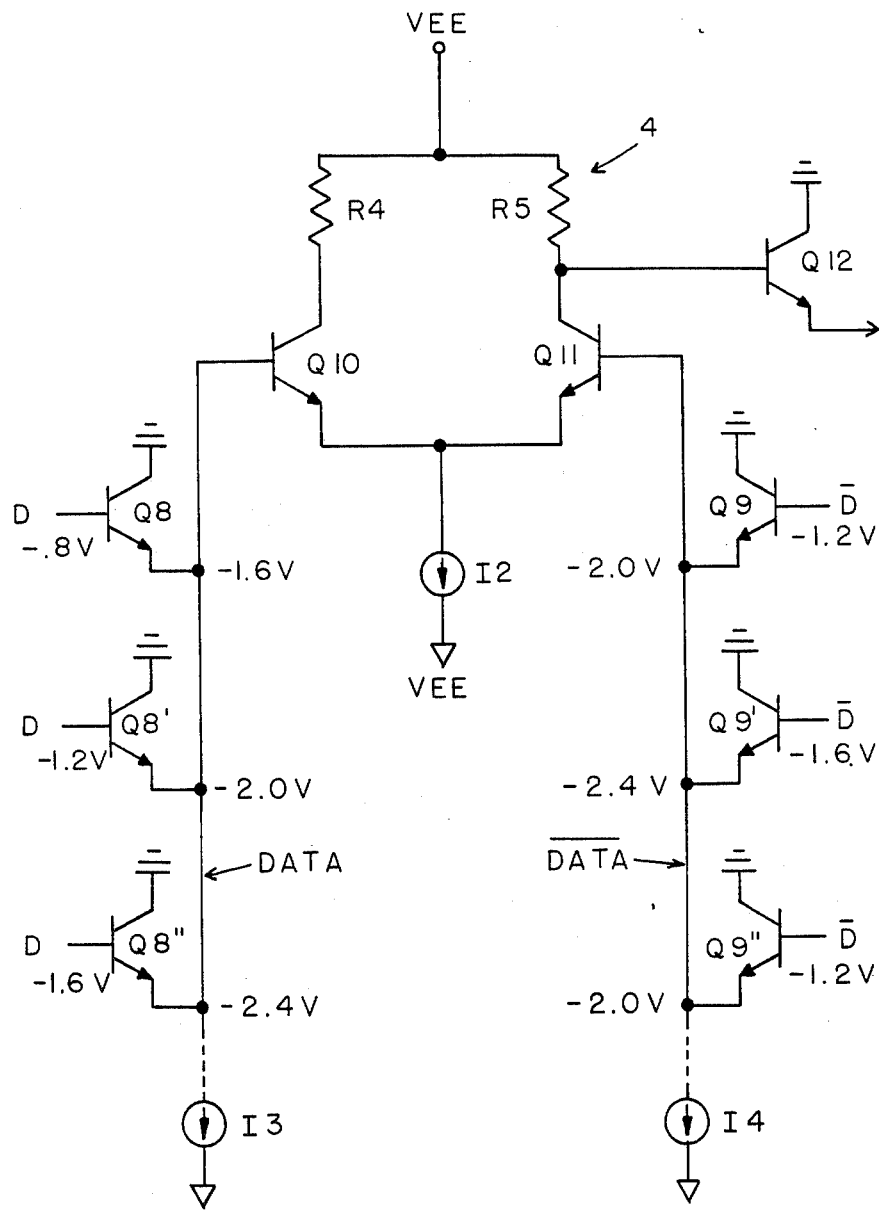
FIG. 3 discloses a schematic diagram of the data output bus and sense amplifier circuitry.

Turning now to the cell's functioning during a read operation, the voltage at the read select input by way of associated read circuitry (not shown) is raised from the nominal −1.2 volts to −0.8 volts and reflected by the data/ndata output bus at the sense amplifier of FIG. 3. That is and recalling that the collector voltage was −1.6 volts on Q1 and −1.2 volts on Q2, with the raising of the read select input to −0.8 volts, the collector voltage on Q1 and Q2 will each rise by 0.4 volts. Specifically, the collector of Q1 and the base of Q9 will rise to −1.2 volts, while the collector of Q2 and base of Q8 will rise to −0.8 volts. The voltage separation at the collectors of Q1 and Q2 thus does not change nor the previously established current flow through Q1 and Q2 and the cell's binary state remains unchanged, until possibly the next write enable clock pulse.

With the shift in the selected cell's collector voltages, an anomalous output voltage (i.e. −0.8 volts) is produced that is detectable by the sense amplifier. This condition can be seen by contrasting the response of the selected and non-selected cells.

Referring to a non-selected cell first and assuming a 0.8 volt drop across the base-emitter junctions of each transistor, when the collector voltages of its storage transistors Q1 and Q2 are at the mentioned −1.6 and −1.2 volts, they are reflected by way of transistors Q8 and Q9 and the data/ndata output bus at the sense amplifier as −2.4 and −2.0 volts. Similarly, the outputs from each of the other non-selected cells are −2.4 and −2.0 volts. The outputs of the selected cell, in contrast, are reflected at the sense amplifier as −1.6 volts and −2.0 volts. The −1.6 volt output thereafter being particularly sensed and interpreted by the sense amplifier.

Sense Amplifier

Attention is accordingly next directed to FIG. 3 and wherein a schematic diagram is shown of the data/ndata bus of a number of cells within one column of an array of cells and coupled to one end of which is a sense amplifier 4. Specifically, the output transistors Q8, Q8', Q8", and Q9, Q9', Q9" from as many cells as can be accommodated by a single sense amplifier (i.e. 32 cells for the presently preferred embodiment and where also two sense amplifiers are used to accommodate the sixty-four possible addresses) are coupled to the data/ndata bus. The one end of the bus terminates in current sources I3 and I4.

The opposite end of the data/ndata bus is coupled to the sense amplifier 4 and, in particular, the individual data/ndata bus legs are respectively coupled to the bases of complementary transistors Q11 and Q11. The collectors of Q10 and Q11, in turn, are coupled in serial parallel relation between reference voltage source VCC and resistors R4 and R5, while the emitters are coupled to current source I2.

With this circuit construction in mind and with the application of a read select signal, the voltage from Q8 of the selected cell is raised to a −1.6 volts. Appreciating further that this voltage is the most positive of all of the possible data bus voltages (i.e. either −2.0 volts or −2.4 volts), the output of transistor Q8 dominates the data bus. That is, it raises the data bus voltage to a −1.6 volts and reverse biases the other transistors Q8' and Q8" to prevent their conduction.

The output voltage from Q9 of the selected cell, in turn, raises the ndata bus to a −2.0 volts. This voltage again being the most positive possible voltage of the other transistors Q9' or Q9" coupled thereto (i.e. −2.0 or −2.4 volts). Consequently, the output of transistor Q9 dominates the ndata bus.

A 0.4 volt differential is thus established between the data and ndata buses and the bases of transistors Q10 and Q11 which causes transistor Q10 to conduct and steer current through resistor R4 to the current source I2. The collector voltages at transistor Q10 is consequently made less than that at Q11 and is sensed by way of transistor Q12 as either a binary 1 or 0. Alternatively, if transistor Q1 of the selected cell reflected the anomalous collector voltage, then the voltage of the ndata bus would be raised above that of the data bus and transistor Q11 would conduct, with a relatively more negative voltage being applied to Q12 and reflected as the other binary state.

Backing up for a moment and reflecting on the operation of the memory cell, it is to be appreciated that the above described read and write operations are totally independent of one another. That is, because the read select input has no effect on the write operation and because only the selected cell exhibits an anomalous output voltage, each cell may be simultaneously read or written at the same time as any other memory cell, including itself. For most circumstances though, it is expected that data would not be written into the same cell as that selected for a read operation; but, should a read operation overlap a write operation, any change in the cell's data will ripple through to the sense amplifier, where it must be dealt with. In any event though, it is believed that the availability of the present memory will allow the system designer greater freedom and flexibility in designing systems with improved memory throughput and performance.

Relative to the alpha particle insensitivity of the present memory cells, it is to be appreciated that such a feature is achieved by operating the current source I1 (FIG. 2) at relatively higher current levels than might otherwise be needed which provides a higher noise margin relative to possible alpha particles.

General Register Stack

Figure 4:
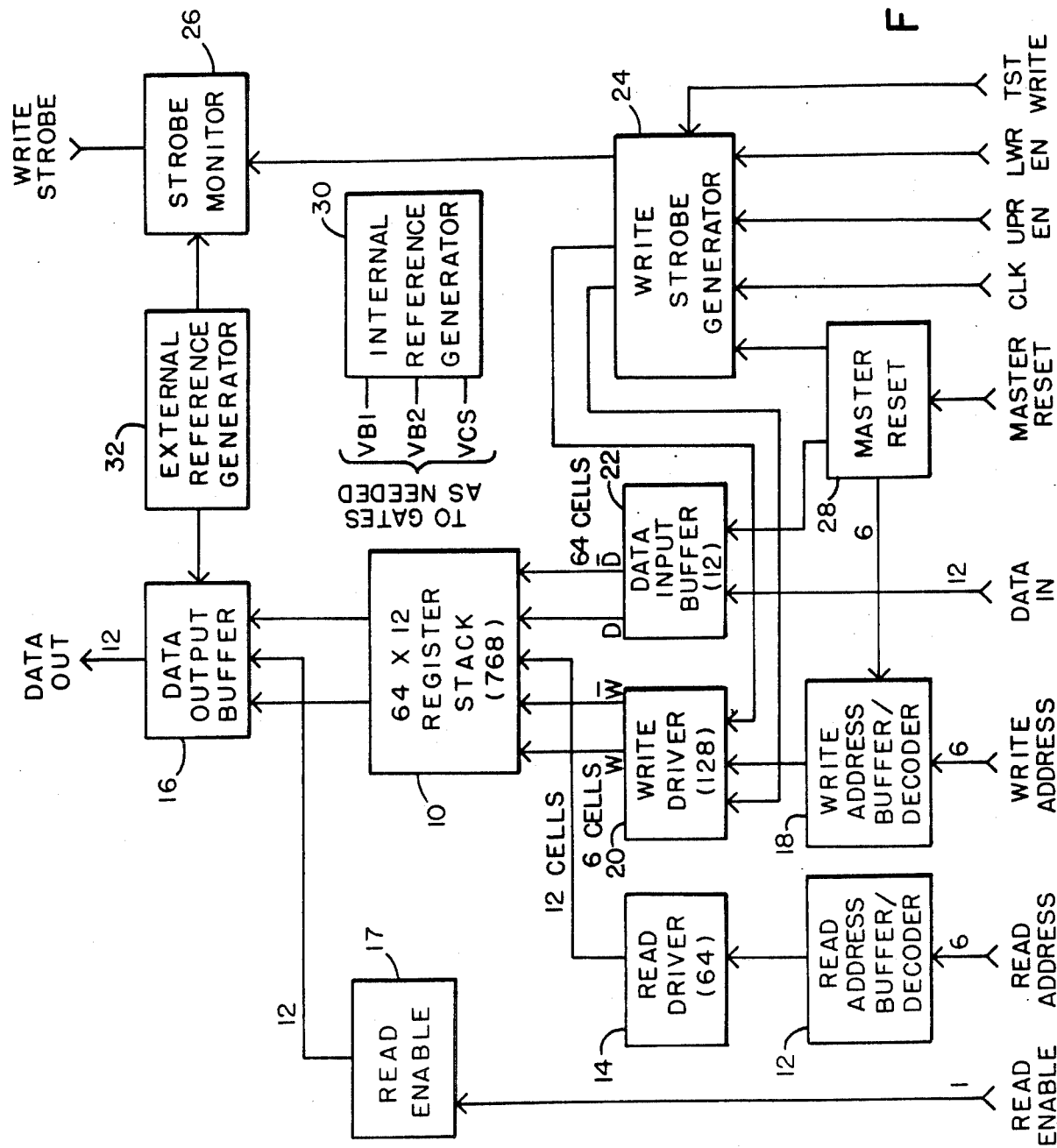
FIG. 4 shows a generalized block diagram of a general register stack constructed about an array of the present memory cells.

Turning attention next to FIG. 4, a block diagram is shown of a 64 row × 12 column general register stack 10 constructed from cells of the type disclosed in FIG. 2. Specifically, 64 addressable 12 bit words may be stored by way of the 768 cells of array 10. The stored data is accessible by way of a 6-bit read address brought in through read address buffer/decoder 12 and used to select a specific one of the 64 read drivers 14. Each read driver 14 is coupled to a unique one of the possible addresses to drive the read select inputs to all 12 cells comprising each word. Each of the 12 columns of cells are, in turn, coupled directly to a data output buffer 16, such that upon selecting one of the 64 addresses, the data from the 12 selected cells is coupled by way of the data/ndata buses and the sense amplifiers of the data output buffer 16 as 12 bits of parallel binary data.

Read enable circuitry 17 is also provided which, in response to a 1 bit read enable input, forces each of the outputs of the data output buffer 16 to a logic low condition.

In order to write each of the 64 addresses, 6 bits of write address information are coupled by way of the write address buffer/decoder 18 and write drive 20 to the array 10. It is to be noted however that in the present embodiment, a split-word write operation is provided. In other words, the upper 6 bits of each of the sixty-four 12 bit wide data locations are written separately from the lower 6 bits. Consequently, instead of 64 write drivers, 128 write drivers are required, with 64 of the write drivers driving the write/nwrite inputs to the upper 6 bits and 64 driving the write/nwrite inputs to the lower 6 bits of each 12 bit word.

Depending then on which address is selected, a separate upper or lower write enable signal is applied to ensure the order of which 6 bits is written first. This latter selection is achieved by way of write strobe generator 24 which, in response to a clock input and either an upper or lower write enable input, produces a write enable signal to clock the upper or lower 6 bits of all 64 addresses. The 12 bits of data are, in turn, coupled by way of data input buffer 22 to each of the data/ndata inputs of each of the 12 cells of all 64 addresses. In combination therefore, the write address buffer/decoder 18 and write strobe generator 24 ensure that with each write enable, only the upper or lower 6 bits of the selected address are written.

One other feature of note is the ability of the memory of FIG. 4 to write all of the memory cells to a logic low condition and which is achieved by way of the master reset circuitry 28. In particular, the master reset circuitry 28, by way of the write address buffer/decoder 18, selects all 64 addresses at once. At the same time, it forces all 12 outputs of the data input buffer 22 to a logic low condition, as the write strobe generator 24 applies a write enable signal. This then writes all 12 bits of each of the selected 64 addresses to a logic low condition.

Also shown in FIG. 4 is the internal voltage reference generator 30 and the external voltage reference generator 32 used to provide appropriate reference voltages to the mentioned circuitry.

While the present invention has been described with respect to its presently preferred embodiment, it is to be appreciated that still other embodiments and modifications may be made thereto, without departing from the spirit and scope of the invention. It is accordingly contemplated that the following claims should be interpreted so as to include all those equivalent embodiments within the spirit and scope of the foregoing described invention.

What is claimed is:

1. A semiconductor memory including a plurality of bipolar transistor memory cells, wherein each bipolar transistor has a base, an emitter and a collector and memory wherein each memory cell comprises:
   (a) a voltage source;
   (b) a current source;
   (c) first and second memory transistors, the emitters of which are coupled together and the collectors of which are coupled to said voltage source via intermediate first and second resistors; and
   (d) current steering means comprising:
      (i) a first portion having third and fourth bipolar transistors, wherein the emitter of each is coupled to the other and the collector of each is coupled to the collector of one of said first and second transistors and the base of each is coupled to one of a pair of data input signals; and
      (ii) a second portion having fifth and sixth bipolar transistors, wherein the emitter of each is coupled to the other and to said current source, the collector of each is coupled to the emitter of one of said pairs of first and second and third and fourth transistors and the base of each is coupled to one of a pair of write control signals,
   said data input and write control signals being defined by pairs of signals of differential magnitudes for steering the current of said current source through one or the other of said first and second transistors and said first and second portions relative to said data input signals to establish and maintain a differential collector voltage separation at said first and second transistors representative of a binary data condition.

2. A memory cell as set forth in claim 1 wherein said second portion of said current steering means establishes the binary data condition of said cell during a write enable portion of said write control signals independent of initial current flow through said first and second transistors and thereafter maintains the established current flow through the transistor pair.

3. A memory cell as set forth in claim 1 including read means coupled to the collectors of said first and second transistors for varying the absolute magnitude of the collector voltages thereof without affecting the differential separation therebetween and such that the collector voltage of one of said transistors is distinguishable from that of a plurality of other cells of the array.

4. Apparatus as set forth in claim 1 including seventh and eighth emitter-follower coupled transistors wherein the base of each is coupled to one of the collectors of said first and second transistors and the emitter of each is coupled to one of a first and second data output bus.

5. Apparatus as set forth in claim 4 including:
   (a) means for selectively varying the absolute magnitude of said voltage source and the collector voltage of each memory transistor of at least one of said plurality of cells without affecting the differential separation therebetween and such that the collector voltage of one of said memory transistors is distinguishable from the other cells coupled to the first and second data buses; and
   (b) means having ninth and tenth transistors, the emitters of which are coupled together to a second current source and each of the bases of which are coupled to one of the first or second data buses for sensing the data condition of the selected cell and producing a corresponding binary output signal.

6. A semiconductor memory including a plurality of bipolar transistor memory cells, wherein each bipolar transistor has a base, an emitter and a collector and wherein each memory cell comprises:

(a) a voltage source;

(b) a current source;

(c) first and second memory transistors, wherein the emitter of each is coupled to the other and the collector of each is coupled to said first voltage source via intermediate first and second resistors;

(d) third and fourth transistors, wherein the emitter of each is coupled to the other and the collector of each is coupled to the collector of one of said first and second transistors and the base of the other of said first and second transistors and the base of each is coupled to one of the pair of data input signals;

(e) fifth and sixth transistors, wherein the emitter of each is coupled to the other and to said current source, the collector of each is coupled to the emitter of one of said pairs of first and second and third and fourth transistors and the base of each is coupled to one of the write control signals;

(f) seventh and eighth emitter-follower coupled transistors, wherein the base of each is coupled to one of the collectors of said first and second transistors and the emitter of each is coupled to one of a first and second data bus;

(g) wherein said first and second transistors during a write operation and with the presence of said write control and data input signals steer the current of said current source to establish and maintain a differential voltage between the collectors of said memory transistor pair determinative of a binary data condition; and including (h) read select means (during a read operation) for the selectively varying the absolute magnitude of said voltage source and the absolute magnitude of the collector voltage of each memory transistor of at least one of said plurality of cells without affecting the differential separation therebetween and such that the collector voltage of the memory transistors of the selected cell is distinguishable from all the other cells coupled to the first and second data buses.

7. Apparatus as set forth in claim 6 wherein each cell is simultaneously responsive to applied read and write control signals.

8. Apparatus as set forth in claim 6 wherein the cells are coupled to each other to define a plurality of data words and including:

(a) means for decoding a read address signal and selecting the cells to be read of one of said words during a read operation; and (b) means for decoding a write address signal and selecting the cells of one of said words to be written during a write operation.

9. Apparatus as set forth in claim 8 including means coupled to said write address means for writing selected cells of a word out of their otherwise normal order upon detecting a split word write central signal.

10. Apparatus as set forth in claim 9 including means for setting the data condition of all the memory cells to a logic low condition.

11. Apparatus as set forth in claim 10 including means for setting the data condition of all the cells of each word to a logic low condition as they are read.

12. Memory apparatus having a plurality of bipolar transistor memory cells, wherein each bipolar transistor has a base, an emitter and a collector and wherein each cell comprises:

(a) a first current source;

(b) a first pair of transistors coupled together and to said first current source at their emitters and each of their bases coupled to one of a differential pair of write control signals;

(c) a second pair of transistors coupled together and to the collector of one of the transistors of said first transistor pair at their emitters and each of their bases coupled to one of a differential pair of data input signals;

(d) a voltage source;

(e) a third pair of memory transistors coupled together and to the collector of the other transistor of said first transistor pair at their emitters, to said first voltage source via intermediate first and second resistors at each of their collectors and each of their bases coupled to one of the collectors of said second transistor pair; and (f) wherein said first and second transistor pairs during a write operation and with the presence of said write control and data input signals steer the current of said current source to establish and maintain a differential voltage separation between the collectors of said third pair of memory transistors determinative of a binary data condition.

13. Apparatus as set forth in claim 12 including first and second emitter-follower coupled transistors, the base of each of which is coupled to one of the collectors of said third pair of memory transistors and the emitter of each of which is coupled to one of a first and second data output bus.

14. Apparatus as set forth in claim 13:

wherein said voltage source comprises a read select bus and means for varying the voltage magnitude thereof during a read operation at one of said cells for varying the absolute magnitude of the collector voltages of said memory transistors without affecting the differential sepration therebetween and such that the collector voltage of one of said memory transistors is distinguishable from all the other cells coupled to the first and second data buses; and including (b) means having a fourth transistor pair the emitters of which are coupled together to a second current source and each of the bases of which are coupled to one of the first or second data buses for sensing the data condition of the selected cell and producing a corresponding binary output signal.

15. A semiconductor memory including a plurality of bipolar transistor memory cells, wherein each bipolar transistor has a base, an emitter and a collector and wherein each memory cell comprises:

(a) a voltage source;

(b) a current source;

(c) first and second memory transistors, the emitters of which are coupled together and the collectors of which are coupled to said voltage source via intermediate first and second resistors;

(d) current steering means having a first portion coupled to a pair of data input signals and to the collectors of said first and second memory transistors and a second portion coupled to a pair of write control signals and to the emitters of said first and second transistors and said current source, said data input and write control signals being defined by pairs of signals of differential magnitudes, for steering the current of said current source through one or the other of said first and second transistors and said first and second portions relative to said data input and write control signals to establish and maintain a differential collector voltage separation at said first and second transistors representative of a binary data condition; and (e) read select means for selectively varying the absolute magnitude of said voltage source and the collector voltage of each memory transistor of at least one of said plurality of cells without affecting the differential separation therebetween and such that the collector voltage of one of said memory transistors is distinguishable from the other cells coupled to the first and second data buses.

* * * * *